(12) United States Patent
Okuda

(10) Patent No.: US 6,822,915 B2
(45) Date of Patent: Nov. 23, 2004

(54) METHOD AND CIRCUIT FOR CHARGING A SIGNAL VOLTAGE THROUGH A SEMICONDUCTOR MEMORY DEVICE

(75) Inventor: Tomio Okuda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/626,431

(22) Filed: Jul. 23, 2003

(65) Prior Publication Data

US 2004/0125668 A1 Jul. 1, 2004

(30) Foreign Application Priority Data

Jul. 23, 2002 (JP) ........................................ 2002-214265

(51) Int. Cl.[7] ................................................. G11C 7/00
(52) U.S. Cl. ......................... 365/203; 365/205; 365/207
(58) Field of Search ................................. 365/203, 205, 365/207, 189.09, 149

(56) References Cited

U.S. PATENT DOCUMENTS 5,481,500 A * 1/1996 Reohr et al. ................. 365/203

* cited by examiner

*Primary Examiner*—David Lam
(74) *Attorney, Agent, or Firm*—Katten Muchin Zavis Rosenman (57) ABSTRACT

A semiconductor memory device includes first and second voltage sources that have at least one different charging characteristic from each other, and performs first and second cycles each of which comprises steps of charging the signal by the first voltage source, switching from the first voltage source to the second voltage source, and charging the signal by the second voltage source after the switching step. At least one of a first time period, for which the first voltage source charges the signal, and a second time period, for which the second voltage source charges the signal, in the first cycle is different from that/those in the second cycle.

16 Claims, 8 Drawing Sheets

METHOD AND CIRCUIT FOR CHARGING A SIGNAL VOLTAGE THROUGH A SEMICONDUCTOR MEMORY DEVICE

BACKGROUND OF THE INVENTION

This invention relates to semiconductor devices. In particular, this invention relates to reduction of power consumption of DRAM (Dynamic Random-Access Memory) devices.

In proportion as storage capacity of a DRAM device is increasing, its power consumption is increasing in recent years. Techniques for decreasing power consumption of DRAM devices are being required more strongly. In order to elevate voltage of signals to step-up voltage, DRAM devices include internal electrical power source, or internal power supply circuits, which is inefficient to transform voltage. It is therefore required to reduce power consumption for generating step-up voltage.

According to one technique for reducing the power consumption, an external power supply circuit elevates signal voltage to a first level, which is lower than the predetermined step-up voltage, and then, the internal power supply circuit elevates the signal voltage from the first level to the step-up voltage. Generally, external power supply circuits are more efficient than internal ones. Therefore the power consumption can be reduced.

Figure 1:
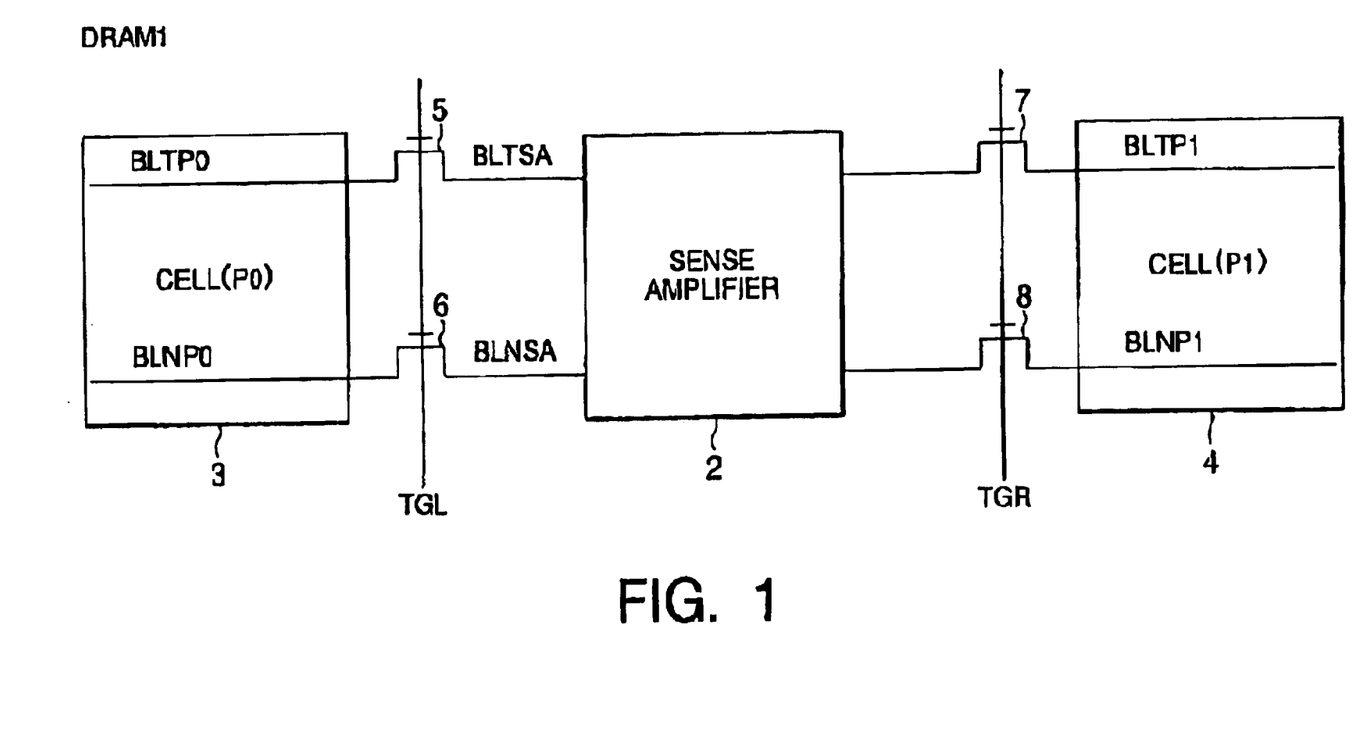
FIG. 1 shows a block diagram for use in describing the DRAM 1 including the sense amplifier 2, plates 3 and 4.

With reference to FIG. 1, a DRAM 1 to which the above-mentioned technique is adopted is described. In the DRAM 1, each sense amplifier 2 is connected to two plates 3, 4. The left side of the sense amplifier 2 is connected to the plate 3. The right side of the sense amplifier 2 is connected to the plate 4. Signals, or faint differences of voltages, are provided from cells on the plates 3 and 4 to the sense amplifier 2. Namely, the difference of voltage between the signals BLTP0 and BLNP0 is provided from the cell (P0) on the plate 3 to the sense amplifier 2 via bit lines BLTSA and BLNSA. The difference of voltage between the signals BLTP1 and BLNP1 is provided from the cell (P1) on the plate 4 to the sense amplifier 2 via the bit lines BLTSA and BLNSA. The sense amplifier 2 amplifies these differences of voltages. A shared signal TGL is connected between the sense amplifier 2 and the plate 3. Another shared signal TGR is connected between the sense amplifier 2 and plate 4.

Figure 2:
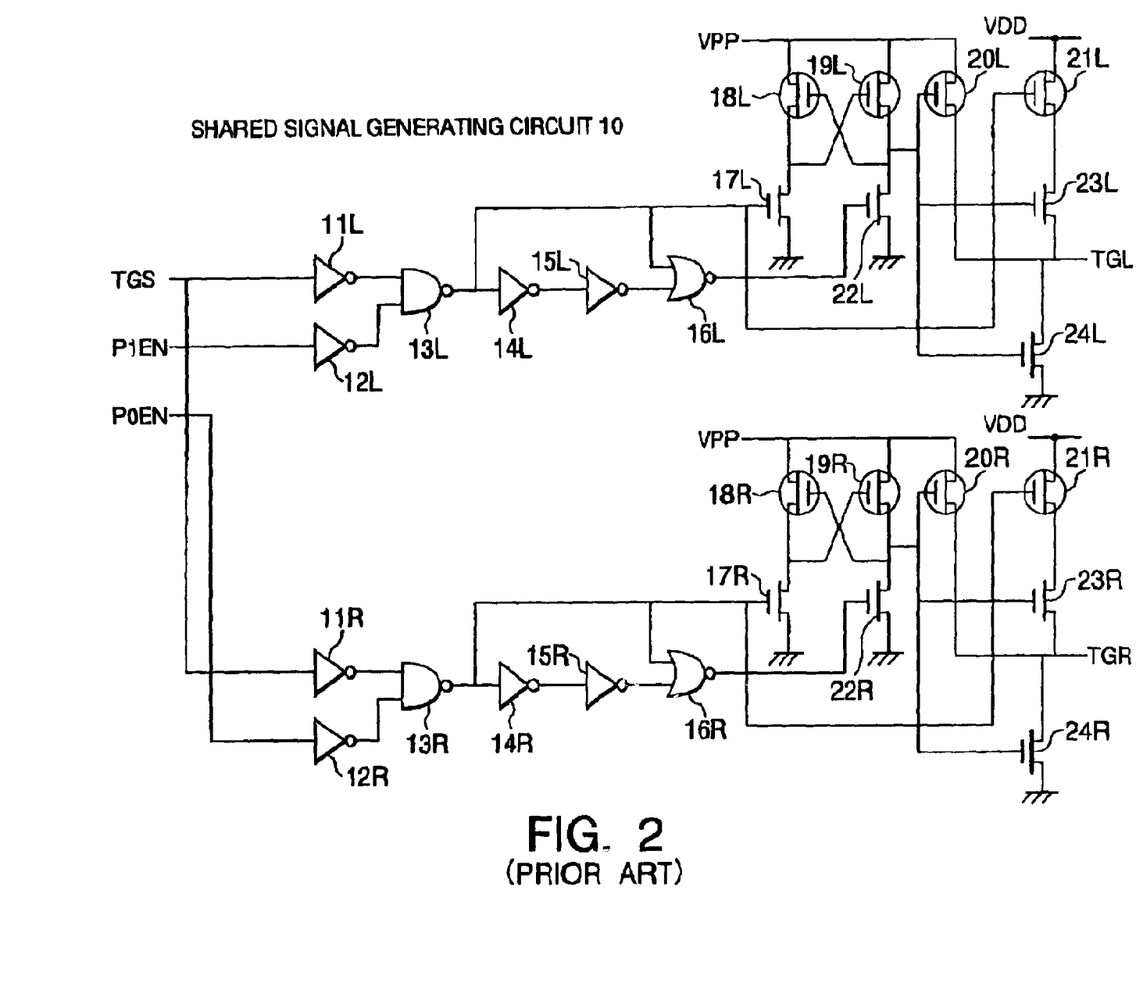
FIG. 2 shows a circuit diagram of a conventional shared signal generating circuit 10.

Conventionally, the shared signals TGL and TGR are generated by a shared signal generating circuit 10 shown in FIG. 2. The signal TGS is input to inverters 11L and 11R. A plate-selecting signal P0EN is input to an inverter 12R. A plate-selecting signal P1EN is input to an inverter 12L. The outputs from the inverter 11L and 12L are provided to a NAND circuit 13L. The output of the NAND circuit 13L is divided into two lines. One is input via inverters 14L and 15L to a NOR circuit 16L. The other is directly input to the NOR circuit 16L. It is assumed that the inverters 14L and 15L have enough delay time. The inverters 14L, 15L and the NOR circuit 16L cause timing for switching from an external voltage source VDD to a step-up voltage source VPP. A NAND circuit 13R, inverters 14R, 15R and a NOR circuit 16R act in similar fashion. The step-up voltage source VPP is provided via transistors 18L, 19L, 20L, 18R, 19R and 20R. The external voltage source VDD is provided via transistors 21L and 21R.

Figure 3:
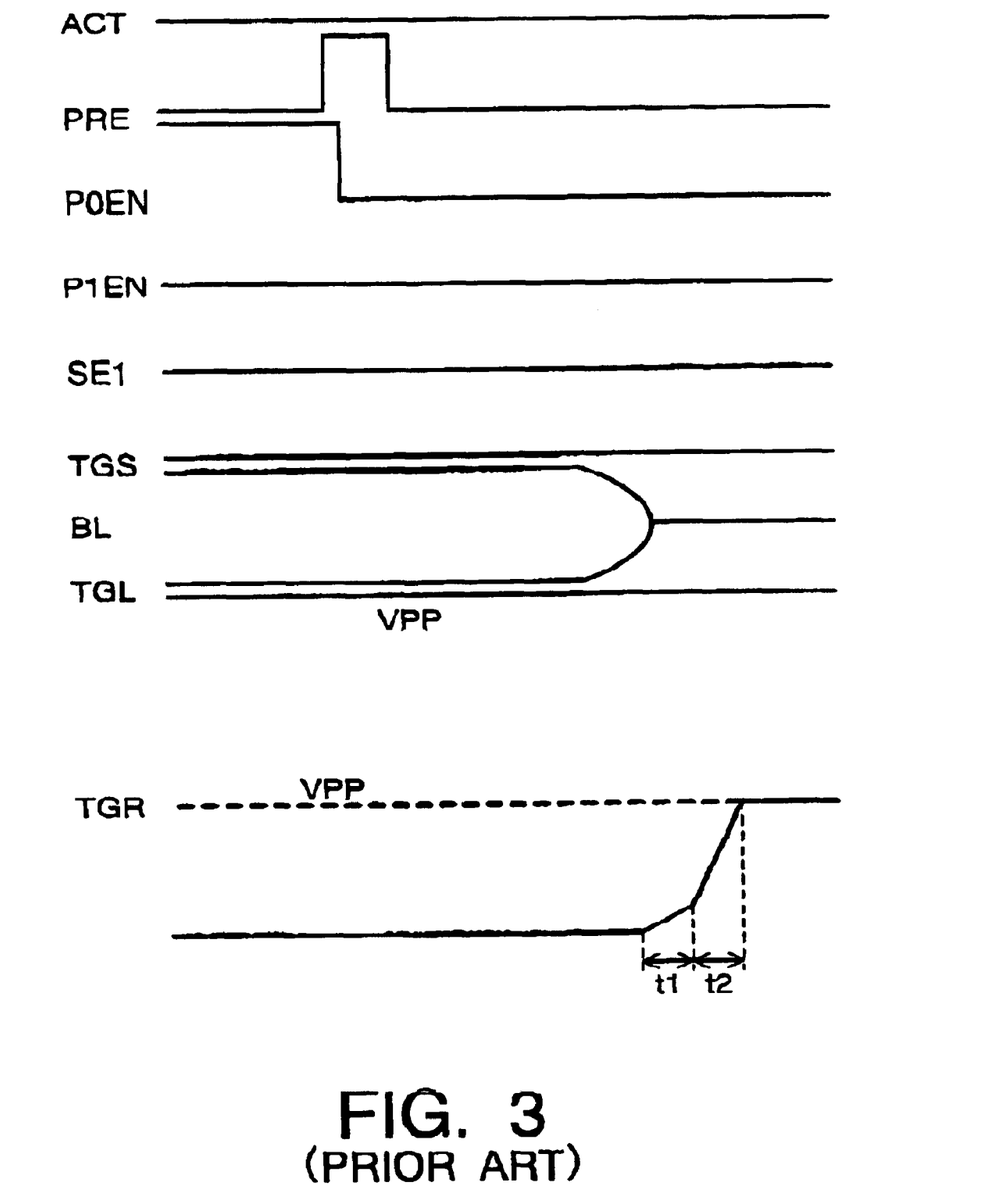
FIG. 3 shows a timing chart for use in describing the shared signal generating circuit 10.

As shown in FIG. 3, when the shared signal generating circuit 10 pre-charges the cell on the plate 3, first, the shared signal TGR is charged by the external voltage source VDD during the time period t1 and then, the shared signal TGR is charged by the step-up voltage source VPP during the time period t2. Hereinafter, the time period t1 may be referred to as the external charging period, and the time period t2 may b referred to as the internal charging period.

It is noted that the inclination of the signal TGR in FIG. 3 is smaller in the time period t1 than in the time period t2. It is further noted that if the external voltage source VDD charges the shared signal for a longer time period, then the power consumption for charging the shared signal becomes smaller.

In order to meet requirement of cell restore characteristic (tRC specification) of a DRAM device, the external charging period in the sense cycle receives severer restriction than that in the pre-charge cycle. On the other hand, because of the circuitry of the shared signal generating circuit 10, the external charging period in the pre-charge cycle is equal to that in the sense cycle. Therefore, the external charging period in the pre-charge cycle receives the same restriction as that in the sense cycle does. Namely, the circuitry of the circuit 10 shortens the external charging period in the pre-charge cycle, and consequently, causes unnecessary power consumption.

Further, power consumption at the step-up voltage supply circuit generates noise. Therefore, it the internal charging period in the pre-charge cycle is becoming longer, then the amount of the noise generated from the internal voltage source VPP in the pre-charge cycle is becoming larger, and consequently, pre-charge characteristic (tRP specification) is becoming worse.

SUMMARY OF THE INVENTION

This invention provides methods and circuits for reducing power consumption for providing the shared signals.

According to one aspect of this invention, a method of charging a signal in a semiconductor memory device is provided. The method is applied to the s miconductor memory device includes first and second voltage sources that have at least one different charging characteristic from each other. The semiconductor memory device performs first and second cycles each of which includes steps of charging the signal by the first voltage source, switching from the first voltage source to the second voltage source, and charging the signal by the second voltage source after the switching step. At least one of a first time period, for which the first voltage source charges the signal, and a second time period, for which the second voltage source charges the signal, in the first cycle is different from that/ those in the second cycle.

For example, the charging characteristic is power consumption for charging the signal. Another example of the charging characteristic is charging speed for charging the signal.

For example, the first cycle is the sense cycle of the semiconductor memory device, and the second cycle is the pre-charging cycle of the semiconductor memory device.

Typically, the first time period in the first cycle is shorter than that in the second cycle.

The first voltage source may be an external voltage source of the semiconductor memory device, and the second voltage source may be an internal voltage source of the semiconductor memory device. The second voltage source may be the step-up voltage source.

Furthermore, according to another aspect of this invention, a circuit for charging a signal in a semiconductor memory device is provided. The circuit is installed in the semiconductor memory device includes first and second voltage sources that have at least one different charging characteristic from each other. The semiconductor memory device performs first and second cycles each of which includes steps of charging the signal by the first voltage source, switching from the first voltage source to the second voltage source, and charging the signal by the second voltage source after the switching step. At least one of a first time period, for which the first voltage source charges the signal, and a second time period, for which the second voltage source charges the signal, in the first cycle is different from that/those in the second cycle.

The semiconductor memory device may include sense amplifiers each of which is connected to two cells. In this case, the circuit for example includes a timing circuit for changing the time instance to perform the switching step in response to a selecting signal for selecting one of the two cells.

For example, timing circuit may include at least one capacitor one of whose terminals is connected to the selecting signal. Otherwise, th timing circuit may include a NOR circuit one of whose inputs is connect d to the selecting signal.

Furthermore, according to another aspect of this invention, a semiconductor memory device including the above-mentioned circuit is provided.

This invention extends the external charging period and shortens the internal charging period in the sense cycle, and to the contrary, extends the internal charging period and shortens the external charging period in the pre-charge cycle. Consequently, at the same time, this invention can restrict the whole charging time in the sense cycle and reduce power consumption for providing the shared signal.

DESCRIPTION OF THE PREFERRED EMBODIMENTS

The shared signal (hereinafter may be referred to as TG) connected between the sense amplifier and the cells on the plates is charged to the step-up voltage. And the shared signal is charged first by the external voltage source and then by the internal voltage source. A feature of the present invention is the difference between the external charging period in the sense cycle and that in the pre-charge cycle.

Generally, a shared signal generating circuit includes delay elements for creating delay time for switching from an external voltage source to an internal voltage source, or a step-up voltage source. According to the present invention, the shared signal generating circuit further includes devices for switching between the delay time in the sense cycle and that in the pre-charge cycle. For example, these devices creat different delay time according to the combination of values of the plate-selecting signal and the shared signal.

Description will be made about a first embodiment of the present invention. Conventionally, the shared signal generating circuit 10 shown in FIG. 2 generates the shared signals TGL and TGR and provides them to the DRAM 1 shown in FIG. 1. In the first embodiment, the shared signal generating circuit 30 is replaced with the circuit 10.

Figure 4:
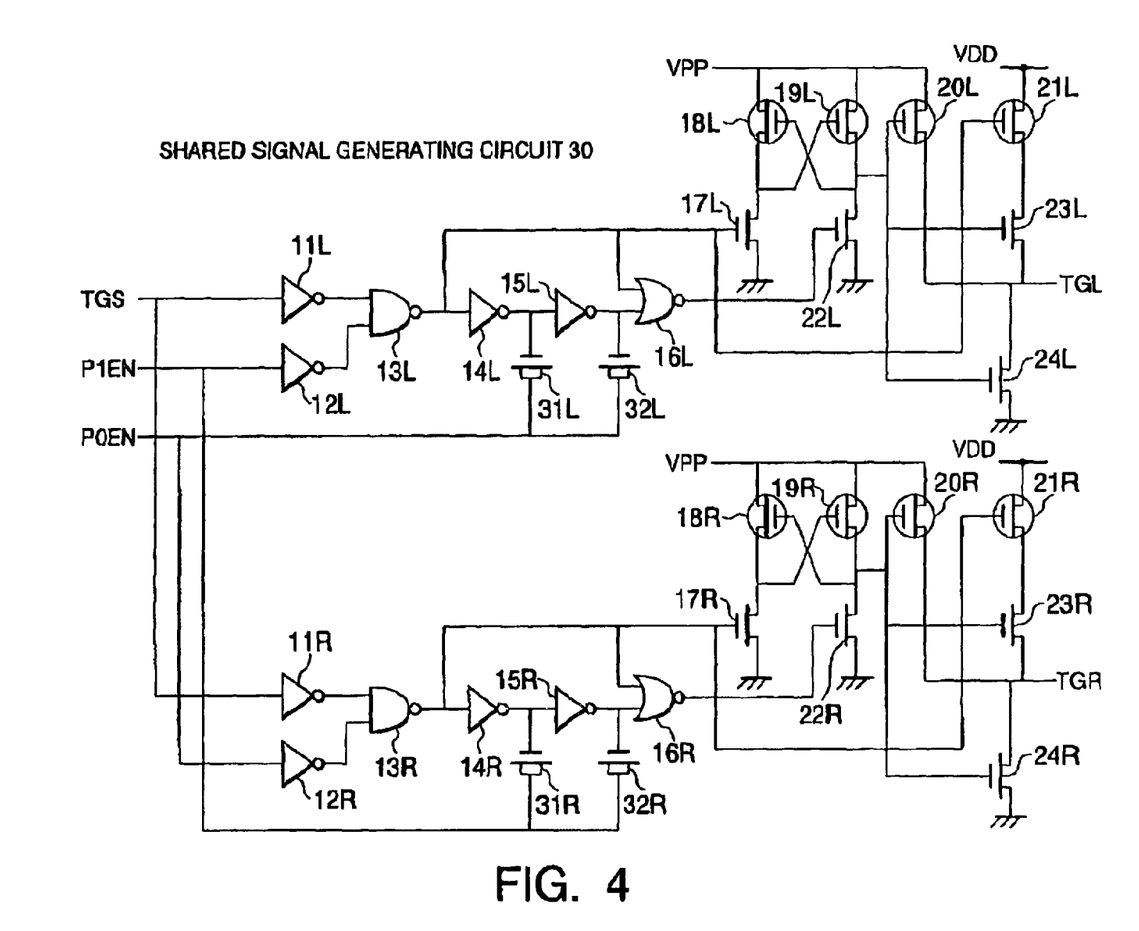
FIG. 4 shows a circuit diagram of a first embodiment of the present invention, a shared signal generating circuit 30.

Four capacitors 31L, 32L, 31R and 32R are shown in FIG. 4. One terminal of the capacitor 31L (31R) is connected with the plate-selecting signal line P0EN (P1EN). The other terminal of the capacitor 31L (31R) is connected between the inverters 14L (14R) and 15L (15R). On the other hand, one terminal of the capacitor 32L (32R) is connected with the plate-selecting signal line P0EN (P1EN). The other terminal of the capacitor 32L (32R) is connected between the inverter 15L (15R) and the NOR circuit 16L (16R).

The operation of the shared signal generating circuit 30 is outlined as the following It is now assumed to charge the shared signal TGL to the high level.

In the sense cycle, the plate-selecting signal P0EN is the high level. In this situation, channels of the capacitors 31L and 32L are not generated, and consequently, the capacitors 31L and 32L have no effect on the delay time.

On the other hand, in the pre-charge cycle, the plate-selecting signal P0EN is the low level. In this situation, the channels are generated and the capacitors 31L, 32L contribute loads to the inverter 14L, 15L to extend the delay time. Consequently, the external charging period is extended, and the internal charging period is shortened.

Much the same is true on charging the shared signal TGR to the high level. In order to describe charging TGR, in the above-mentioned description, the plate-selecting signal P0EN, the shared signal TGL, the capacitors 31L and 32L may be replaced with P1EN, TGR, 31R and 32R, respectively.

As just described, according to the shared signal generating circuit 30, the external charging period in the sense cycle is different from that in the pre-charge cycle. Therefore, the present embodiment can meet requirement from the cell restore characteristic (tRC specification), and at the same time, efficiently reduce power consumption of the step-up voltage source VPP.

Further, description will be made about the shared signal generating circuit 30 in detail. When the sense amplifier 2 senses cell data of the plate 3, first, in response to an ACT command sent from the outside of the DRAM 1, the plate-selecting signal P0EN is elevated to the high level and the shared signal TGR is lowered to the low level. Next, a word line is activated to generate difference of voltages between bit lines BLTSA and BLNSA connected to the sense amplifier 2. Then, the sense amplifier 2 is activated by a sense amplifier activating signal SE1. After that, the signal TGS is elevated to the high level to lower the shared signal TGL to the low level. This reduces workload of the sense amplifier 2 and allows the sense amplifier 2 to perform the sense cycle quickly. Finally, in order to restore the cell of the plate 3, the signal TGS is elevated to lower the shared signal TGL to the low level.

In the pre-charge cycle, the signals BLTP1 and BLNP1 on the plate 4 are pre-charged. Therefore, it is required that the shared signal TGR is the high level.

Next, description will be made about the circuitry of the shared signal generating circuit 30. As described above, the shared signal generating circuit 30 is replaced with the circuit 10. In addition to the circuit 10, the circuit 30 includes the capacitors 31L, 32L, 31R and 32R The inverters 14L, 15L, 14R and 15R have enough delay time.

In the sense cycle, in order to amplify cell data of the plate 3, first, the plate-selecting signal P0EN is elevated to the high level and the shared signal TGR is lowered to the low level. Next, a word line is activated to generate difference of voltages between bit lines BLTSA and BLNSA. Then, a sense amplifier activating signal SE1 is elevated to activate the sense amplifier 2. After that, in order to allow the sense amplifier 2 to quickly amplify the cell data, the signal TGS is elevated to the high level to lower the shared signal TGL to the low level. When the plate-selecting signal P0EN is the high level, channels of capacitors 31L and 32L are not generated. Namely, the capacitors 31L, 32L do not contribute loads to the inverter 14L, 15L, and therefore, the delay time is not extended. After the shared signal TGL has been charged by the external voltage source VDD for the delay time, the shared signal TGL is charged by the step-up voltage source VPP.

In the pre-charge cycle, the plate-selecting signal P0EN is lower to the low level and the shared signal is elevated to the high level. The plate-selecting signal P1EN is the low level. Therefore, the channels of the capacitors 31L and 32L are generated, the capacitors contribute loads to the inverter 14L, 15L, and then, the delay time is extended. As a result, after the shared signal TGL has been charged by the external voltage source VDD for the extended delay time, the shared signal TGL is charged by the step-up voltage source VPP.

The sense amplifier 2, the plates 3, 4 and the cells are well known to those who skilled in the related art, and are irrelevant to the description of the present invention. Therefore, the descriptions about the sense amplifier 2, the plates 3, 4 and the cells are omitted.

Figure 5:
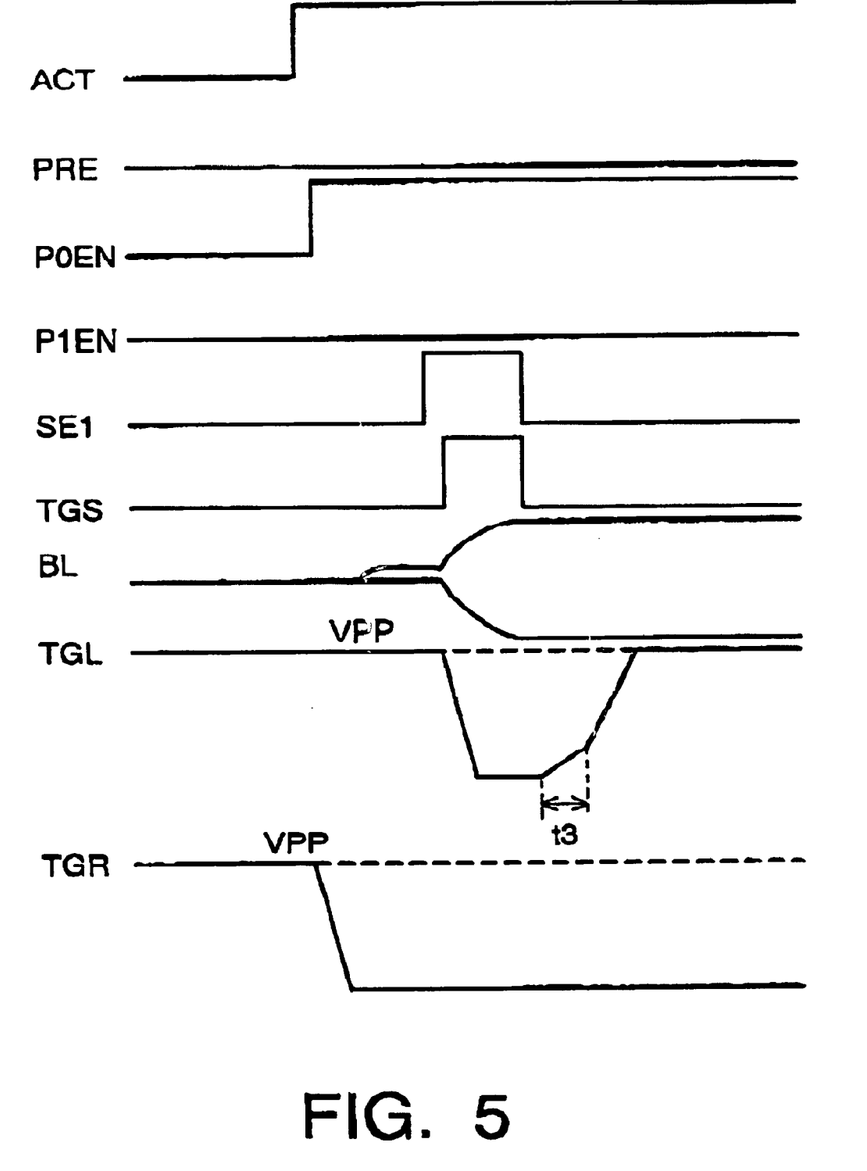
FIG. 5 shows a timing chart for use in describing the shared signal generating circuit 30.

Further, FIG. 5 is referred to describing the sensing cycle of the shared signal generating circuit 30. It is first assumed that the plate-selecting signal P0EN is elevated to sense the value of the cell of the plate 3. In response to the elevation, the shared signal TGR is lower to the low level. The shared signal TGR is connected with the plate 4, which is opposite to the selected plate 3.

Next, the word line of the selected plate 3 is selected. After a predetermined time period has passed, the sense amplifier activating signal SE1 is elevated to the high level to perform the sense cycle. In order to speed the sense cycle, the signal TGS is elevated to the high level and the signal TGL is lowered to the low level.

Then, the signal TGS is lowered to the low level and the signal TGL is elevated to the high level in order to perform cell restoration. The elevation of the signal TGL is first made by the external voltage source VDD to reduce power consumption. The rest of the elevation is made by the step-up voltage source VPP. Since the elevation by the external voltage source VDD is slower than that by the step-up voltage source VPP, if the time period t3 of the first elevation is too long, then the cell restoration may not be in time. Therefore, it is noted that the time period t3 should be short enough to complete the cell restoration in time.

Figure 6:
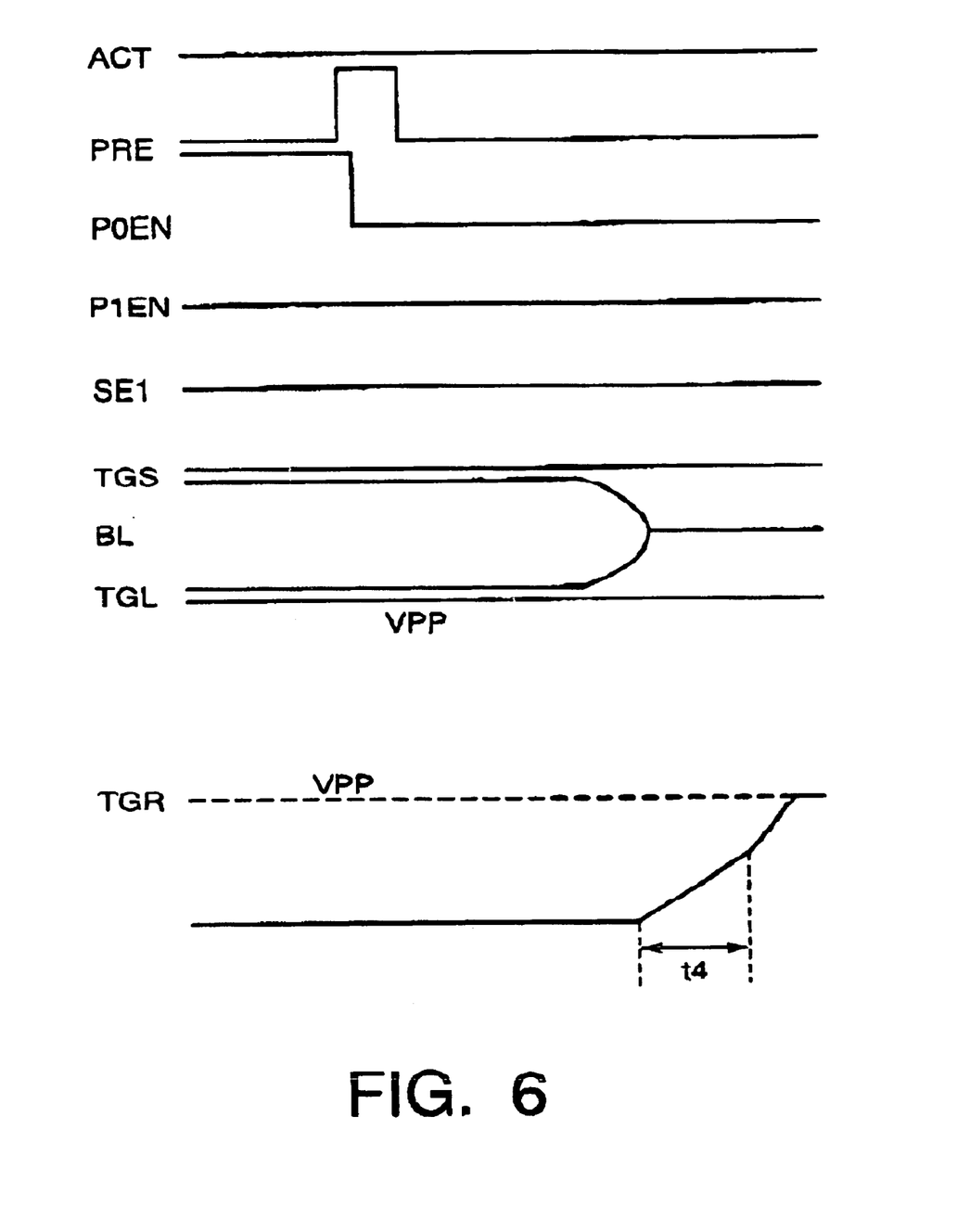
FIG. 6 shows a timing chart for use in describing the shared signal generating circuit 30.

On the other hand, FIG. 6 is referred to describing the pre-charging cycle of the shared signal generating circuit 30. First, the shared signal P0EN is lower to the low level and the shared signal TGR is elevated to the high level. The signal TGR is connected to the non-selected plate 4. Since the plate-selecting signal P1EN is the low level, when the inverters 14R and 15R are activated, the channels of the capacitors 31R and 32R are formed and contribute to the load of the inverters 14R and 15R. In the pre-charge cycle, before the activation of the word line at the next sense cycle, it is required to complete the charge of the signal TGR to the step-up voltage. Compared with the charging in the sense cycle, the completion of the charging may be late. Therefore, the time period t4 for which the external voltage source VDD charges the signal TGR in the sense cycle can be longer than the time period t3.

According to the shared signal generating circuit 30, the time period for which the external voltage source charges the shared signals in the sense cycle can be set a different time from that in the pre-charge cycle. As a result, minimizing delay caused by the cell restoration in the sense cycle can consist with reducing power consumption for charging the shared signal in the pre-charge cycle.

The inventor has experimentally leaned that when the present embodiment is applied to a RDRAM (Rambus DRAM, 256 MB, operating frequency=800 MHz, tSS=20 ns), the VPP current is 23 mA, which is 2 mA lower than 25 mA VPP current of the conventional RDRAM. The 2 mA difference corresponds to 5 mA current of the VDD.

Next, description will be made about a second embodiment of the present invention, a shared signal generating circuit 40. Compared FIG. 7 with FIG. 2, the shared signal generating circuit 40 includes NOR circuits 41L and 41R, instead of the inverters 15L and 15R. The NOR circuit 41L is input from the output of the inverter 14L and the plate-selecting signal P0EN. The NOR circuit 41L outputs to the NOR circuit 16L. Similarly, the NOR circuit 41R is input from the output of the inverter 14R and the plate-selecting signal P1EN. The NOR circuit 41R outputs to the NOR circuit 16R.

Figure 7:
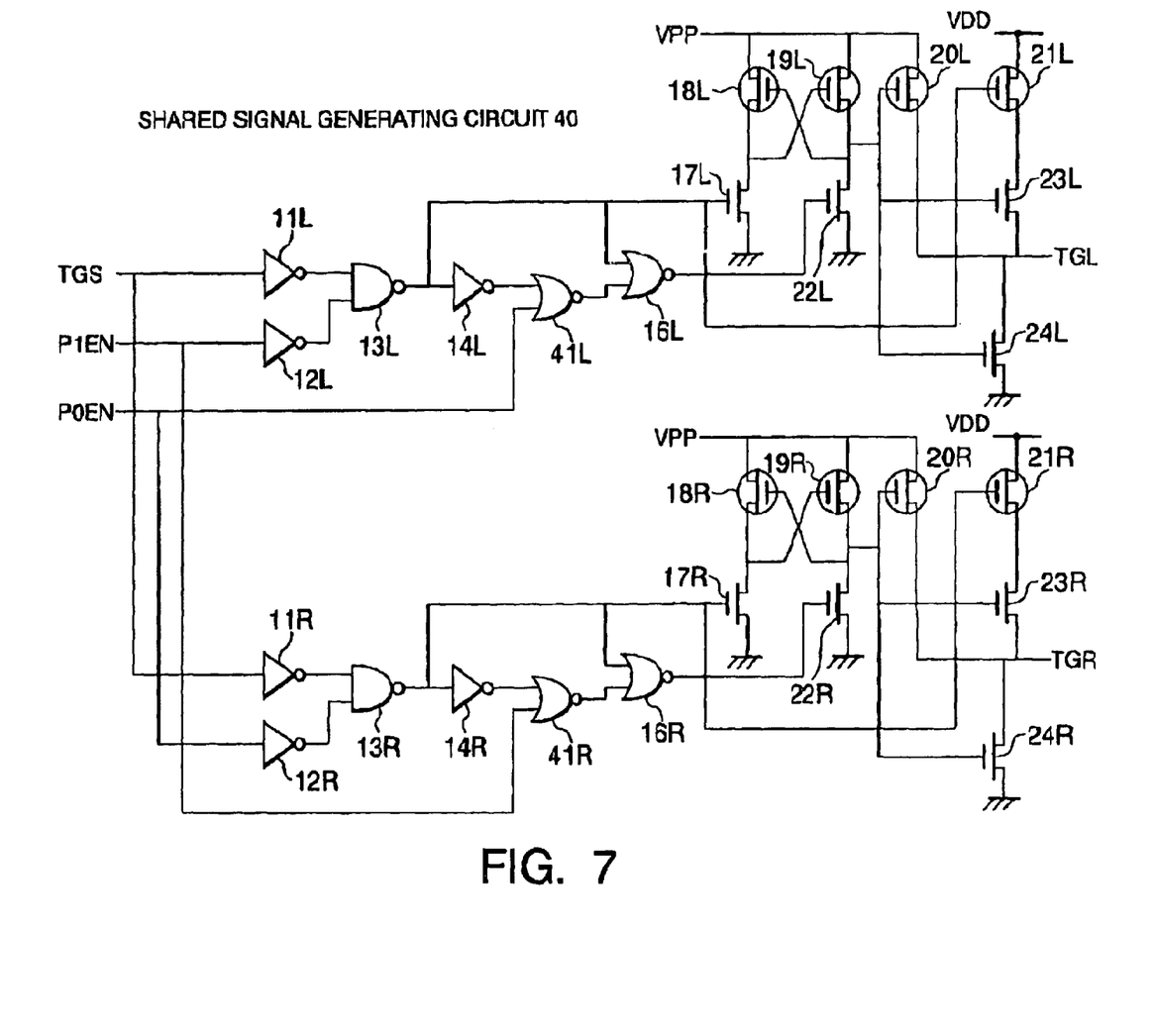
FIG. 7 shows a circuit diagram of a second embodiment of the present invention, a shared signal generating circuit 40.

As show in FIG. 7, if the plate-selecting signal P0EN is the high level, then the delay time caused by the inverter 14L and the NOR circuit 16L is disable, and consequently, the external voltage source VDD does not charge the shared signal TGL. The delay is disable even it the signal TGS is the low level.

Figure 8:
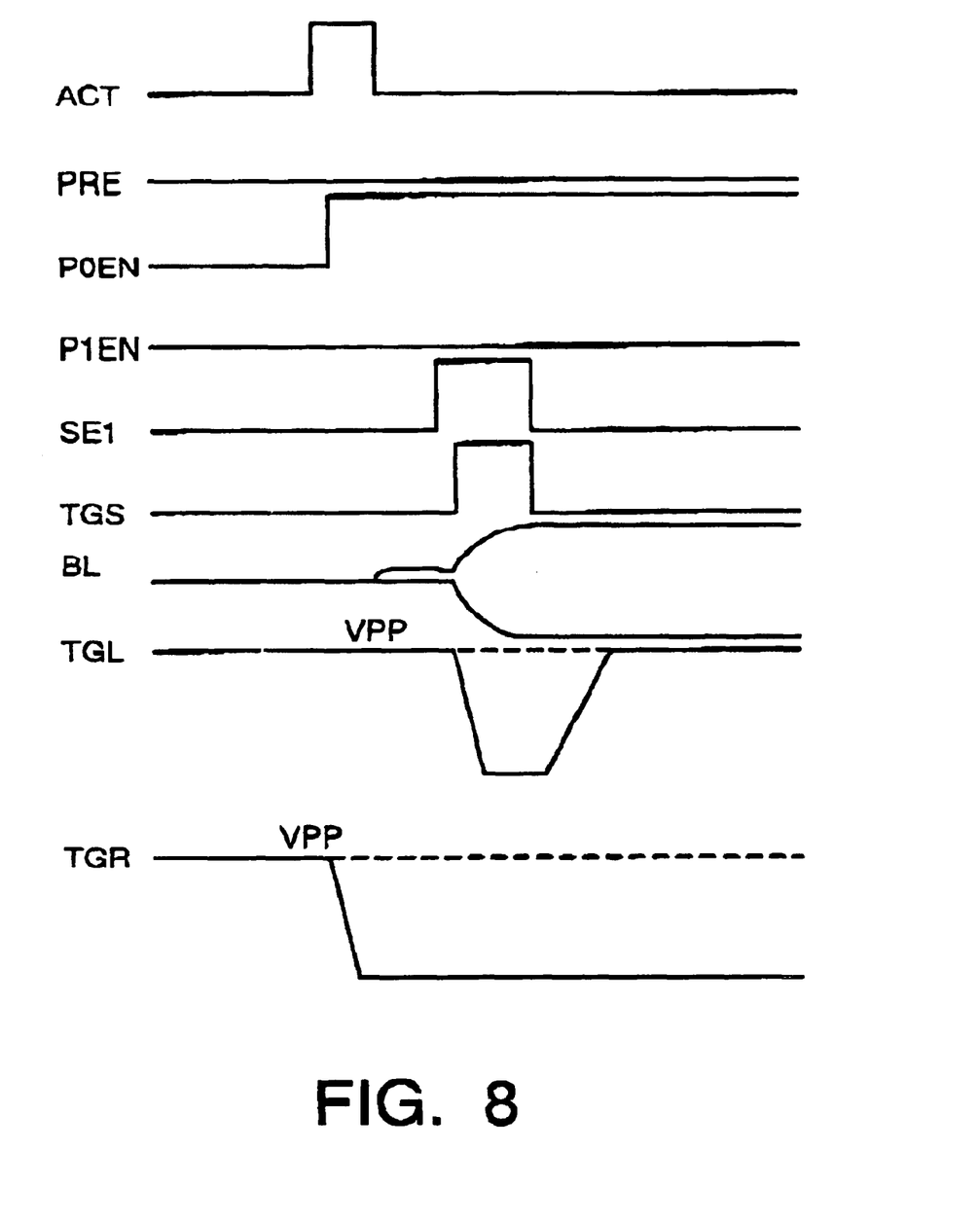
FIG. 8 shows a timing chart for use in describing the shared signal generating circuit 40.

In the sense cycle of the shared signal TGL, the shared signal generating circuit 40 operates as shown in FIG. 8. The shared signal TGL is charged to the step-up voltage only by the step-up voltage source VPP, without the external voltage source VDD. Therefore, the cell-restoration can be completed quickly in the sense cycle, and at the same time, power consumption can be inhibited.

According to the shared signal generating circuit 40, the current consumption caused by the step-up voltage source VPP can be reduced without effect to the cell restore characteristic.

As mentioned above, according to the present invention, the time period to charge the shared signal by the external voltage source depends on whether the charging is performed in the sense cycle or in the pre-charge cycle. Therefore, the present invention can provide a semiconductor memory device which performs with high speed operation and low power consumption.

While this invention has thus far been described in conjunction with a few embodiments thereof, it will be readily possible for those skilled in the art to put the this invention into various other manners. For example, the above-mentioned description may be it is obvious for those skilled in the art that the external voltage source VDD may be replaced with a VDL (a step-down voltage supply to an array), a VPERI (a step-down voltage supply to the peripheral) in the above-mentioned description.

What is claimed is:

1. A method of charging a signal in a semiconductor memory device, wherein:

the semiconductor memory device comprises first and second voltage sources that have at least one different charging characteristic from each other;

the semiconductor memory device performs first and second cycles each of which comprises steps of charging the signal by the first voltage source, switching from the first voltage source to the second voltage source, and charging the signal by the second voltage source after the switching step; and at least one of a first time period, for which the first voltage source charges the signal, and a second time period, for which the second voltage source charges the signal, in the first cycle is different from that/those in the second cycle.

2. The method claimed in claim 1, wherein the charging characteristic is at least one of power consumption for charging the signal and charging speed for charging the signal.

3. The method claimed in claim 1, wherein the first cycle is the sense cycle of the semiconductor memory device, and the second cycle is the pre-charging cycle of the semiconductor memory device.

4. The method claimed in claim 3, wherein the first time period in the first cycle is shorter than that in the second cycle.

5. The method claimed in claim 4, wherein the first voltage source is an external voltage source of the semiconductor memory device, and the second voltage source is an internal voltage source of the semiconductor memory device.

6. The method claimed in claim 5, wherein the second voltage source is the step-up voltage source.

7. A circuit for charging a signal in a semiconductor memory device, wherein:

the semiconductor memory device comprises first and second voltage sources that have at least one different charging characteristic from each other;

the semiconductor memory device performs first and second cycles each of which comprises steps of charging the signal by the first voltage source, switching from the first voltage source to the second voltage source, and charging the signal by the second voltage source after the switching step; and at least one of a first time period, for which the first voltage source charges the signal, and a second time period, for which the second voltage source charges the signal, in the first cycle is different from that/those in the second cycle.

8. The circuit claimed in claim 7, wherein the charging characteristic is at least one of power consumption for charging the signal and charging speed for charging the signal.

9. The circuit claimed in claim 7, wherein the first cycle is the sense cycle of the semiconductor memory device, and the second cycle is the pre-charging cycle of the semiconductor memory device.

10. The circuit claimed in claim 9, wherein the first time period in the first cycle is shorter than that in the second cycle.

11. The circuit claimed in claim 10, wherein the first voltage source is an external voltage source of the semiconductor memory device, and the second voltage source is an internal voltage source of the semiconductor memory device.

12. The circuit claimed in claim 11, wherein the second voltage source is the step-up voltage source.

13. The circuit claimed in claim 7, wherein the semiconductor memory device comprises sense amplifiers each of which is connected to two cells, comprising a timing circuit for changing the time instance to perform the switching step in response to a selecting signal for selecting one of the two cells.

14. The circuit claimed in claim 13, wherein the timing circuit comprises at least one capacitor one of whose terminals is connected to the selecting signal.

15. The circuit claimed in claim 13, wherein the timing circuit comprises a NOR circuit one of whose inputs is connected to the selecting signal.

16. A semiconductor memory device comprising the circuit claimed in claim 7.

* * * * *